US010523176B2

(12) United States Patent
van Liempd et al.

(10) Patent No.: US 10,523,176 B2
(45) Date of Patent: Dec. 31, 2019

(54) FRONT-END MODULE COMPRISING AN EBD CIRCUIT, TELECOMMUNICATION DEVICE COMPRISING THE FRONT-END MODULE AND METHOD FOR OPERATING THEM

(71) Applicants: IMEC VZW, Leuven (BE); Murata Manufacturing Company Ltd., Nagaokakyo-shi, Kyoto (JP); VRIJE UNIVERSITEIT BRUSSEL, Brussels (BE)

(72) Inventors: Barend Wilhelmus Marinus van Liempd, Leuven (BE); Ariumi Saneaki, Leuven (BE)

(73) Assignees: IMEC VZW, Leuven (BE); Murata Manufacturing Company Ltd., Kyoto (JP); Vrije Universiteit Brussel, Brussels (BE)

( * ) Notice: Subject to any disclaimer, the term of this patent is extended or adjusted under 35 U.S.C. 154(b) by 0 days.

(21) Appl. No.: 15/887,462

(22) Filed: Feb. 2, 2018

(65) Prior Publication Data

US 2018/0226941 A1     Aug. 9, 2018

(30) Foreign Application Priority Data

Feb. 9, 2017   (EP) ..................................... 17155349

(51) Int. Cl.
*H03H 7/38*     (2006.01)
*H04B 1/18*     (2006.01)
(Continued)

(52) U.S. Cl.
CPC .............. *H03H 7/38* (2013.01); *H03H 7/463* (2013.01); *H04B 1/18* (2013.01); *H04B 1/525* (2013.01); *H03H 2007/386* (2013.01)

(58) Field of Classification Search
CPC .... H03H 7/38; H03H 7/462; H03H 2007/386; H04B 1/18; H04B 1/525
(Continued)

(56) References Cited

U.S. PATENT DOCUMENTS 3,810,182 A   5/1974  White et al.
4,852,080 A   7/1989  Ohtake et al.
(Continued)

OTHER PUBLICATIONS

European Search Report, European Patent Application No. 17155349. 8, dated Aug. 18, 2017,10 pages.

*Primary Examiner* — Robert J Pascal
*Assistant Examiner* — Kimberly E Glenn
(74) *Attorney, Agent, or Firm* — McDonnell Boehnen Hulbert & Berghoff LLP

(57) ABSTRACT

The present disclosure relates to a front-end module for a telecommunication device with an EBD circuit comprising a hybrid transformer for coupling via a transmit port to the telecommunication device transmitting a first frequency transmit signal, to an antenna, via a receive port to the telecommunication device receiving a second frequency receive signal, and to a tunable impedance circuit. In a first configuration the EBD circuit is configured to isolate the transmit port from the receive port at the first frequency, and the FEM comprises a first filter at the transmit port for attenuating the transmit signal with a predetermined amount at the second frequency. In a second configuration the EBD circuit is configured to isolate the transmit port from the receive port at the second frequency, and the FEM comprises a second filter at the receive port for attenuating the receive signal a predetermined amount at the first frequency.

19 Claims, 12 Drawing Sheets

(51) Int. Cl.
*H03H 7/46* (2006.01)
*H04B 1/525* (2015.01)

(58) Field of Classification Search
USPC .......................................................... 333/126
See application file for complete search history.

(56) References Cited

U.S. PATENT DOCUMENTS

| | | | |
|---|---|---|---|
| 5,790,658 A | 8/1998 | Yip et al. | |
| 9,154,289 B2 * | 10/2015 | Mikhemar | H04L 5/14 |
| 2012/0256702 A1 | 10/2012 | Khlat et al. | |
| 2013/0241670 A1 * | 9/2013 | Mikhemar | H04B 1/52 |
| | | | 333/126 |
| 2014/0146718 A1 * | 5/2014 | Mikhemar | H04L 5/14 |
| | | | 370/278 |
| 2014/0306780 A1 * | 10/2014 | Lehtinen | H03H 7/463 |
| | | | 333/131 |

* cited by examiner

FRONT-END MODULE COMPRISING AN EBD CIRCUIT, TELECOMMUNICATION DEVICE COMPRISING THE FRONT-END MODULE AND METHOD FOR OPERATING THEM

CROSS-REFERENCE TO RELATED APPLICATIONS

The present application is a non-provisional patent application claiming priority to European Patent Application No. 17155349.8, filed Feb. 9, 2017, the contents of which are hereby incorporated by reference.

FIELD OF THE DISCLOSURE

The present disclosure relates to a front-end module, FEM, for a telecommunication device, wherein the FEM comprises an EBD circuit for isolating a transmit signal being transmitted via an antenna from a receive signal being received via the antenna. The present disclosure also relates to a telecommunication device comprising the FEM. The present disclosure also relates to a method for operating the FEM for isolating the transmit signal from the receive signal.

BACKGROUND

Current-day front-end modules, FEM, in mobile communication devices, such as cellular handsets operating according to the long-term evolution, LTE, standard for data and voice communications rely heavily on the use of frequency-division duplexing, FDD, meaning that the transmitter and receiver operate concurrently, at a frequency offset. More and more bands are defined for FDD, and consequently the amount of filters that need to be implemented in the FEM increases. For each band, typically one filter is provided in the transmit, TX, path towards the antenna (preventing TX noise at the receive, RX, frequency to leak into the RX) and one filter is provided in the RX path between antenna and RX (preventing the TX signal to leak into the RX). Currently, fixed-frequency filters are used, which have the disadvantage of being costly, bulky and which do not scale up when more bands are required.

Electrical-balance duplexers, EBDs, of which an example implementation is shown in FIG. 1, promise to replace numerous surface acoustic wave, SAW, based filters in the front-end module of cellular handsets. Instead of supporting only one band, in this case a single duplexer is tuned to support multiple bands. They operate based on signal cancellation using a hybrid transformer, essentially by 'balancing' an antenna $Z_{ANT}$ and a tunable impedance circuit, the so-called balance network or $Z_{BAL}$.

A disadvantage of this architecture is the bandwidth for which sufficient balance or isolation can be achieved, i.e., matching $Z_{BAL}$ to the antenna impedance $Z_{ANT}$, for real antennas that have a highly frequency-dependent impedance characteristic. In FDD operation, isolation is needed at both a first frequency, being the TX frequency, and a second frequency, being the RX frequency. At the TX frequency, the TX signal itself is too large for the receiver to sustain so its power level needs to be reduced through isolation, and at the RX frequency the transmitter emits a large amount of noise that needs to be removed to avoid reducing the signal-to-noise-ratio, SNR, for the typical (small) wanted signal levels that arrive at the antenna. In the EBD, it is possible to isolate one of the two frequencies, but not the other due to limited isolation bandwidth. This is caused by the frequency dependency of the impedance of typical commercial antennas.

SUMMARY

It is an aim of the present disclosure to provide a front-end module, FEM, for a telecommunication device comprising an electrical balance duplexer circuit enabling a better isolation of a signal to be transmitted and a signal to be received.

This aim is achieved according to the present disclosure with a front-end module showing the technical characteristics of the first independent claim.

Therefore, the present disclosure provides a front-end module, FEM, for a telecommunication device. The FEM comprises an electrical balance duplexer, EBD, circuit. The EBD circuit comprises a hybrid transformer configured for being coupled via a transmit port to the telecommunication device to input a transmit signal comprising a signal to be transmitted at a first frequency from the telecommunication device, via an antenna port to an antenna of the telecommunication device, via a receive port to the telecommunication device to output a receive signal comprising a signal to be received at a second frequency to the telecommunication device, and via a balance port to a tunable impedance circuit which is part of the EBD circuit. In an example embodiment, the second frequency is different from the first frequency. The EBD circuit is configured according to one of: a first configuration and a second configuration.

In the first configuration, the EBD circuit is configured to isolate the transmit port from the receive port at the first frequency. With the first configuration of the EBD circuit the FEM further comprises a first filter at the transmit port. The first filter is configured for attenuating the transmit signal with a predetermined amount at the second frequency.

In the second configuration, the EBD circuit is configured to isolate the transmit port from the receive port at the second frequency. With the second configuration of the EBD circuit the FEM further comprises a second filter at the receive port. The second filter is configured for attenuating the receive signal with a predetermined amount at the first frequency.

The use of the first filter with the first configuration of the EBD circuit and the use of the second filter with the second configuration of the EBD circuit means that it is not necessary to obtain a high level of isolation between the transmit port and the receive port at both the first frequency and the second frequency by means of tuning the impedance of the tunable impedance circuit to obtain signal cancellation within the hybrid transformer of the EBD circuit.

In the first configuration of the EBD circuit, the tunable impedance circuit only needs to be able to achieve a good isolation between the transmit port and the receive port at the first frequency, with a good isolation meaning a sufficient isolation depending on the application, e.g., 50 dB or more in the case of 3GPP-LTE in frequency division duplexing, FDD, mode. This is because a reduced isolation between the transmit port and the receive port at the second frequency is compensated for by the attenuation of the transmit signal at the second frequency by the first filter up to a predetermined amount.

In the second configuration of the EBD circuit, the tunable impedance circuit only needs to be able to achieve a good isolation between the transmit port and the receive port at the second frequency, since a reduced isolation between the transmit port and the receive port at the first frequency is compensated for by the attenuation of the receive signal at the first frequency by the second filter up to a predetermined amount. Thus, the design of the tunable impedance circuit may be simplified compared to a balance network incorporating all the required tuning components to allow the device to achieve sufficient isolation at both frequencies.

Furthermore, the use of the first filter with the first configuration of the EBD circuit may reduce receive signal losses going from the antenna port towards the receive port at the second frequency in the case of a high impedance presented at the transmit port at the second frequency and a low impedance offered by the tunable impedance circuit at the second frequency. This implies that the hybrid transformer is close to an ideal transformer which benefits power flow from the antenna port towards the receive port, compared to the traditional 50%-50% receive power split due to hybrid transformer symmetry.

Furthermore, the use of the first filter with the first configuration of the EBD circuit and the use of the second filter with the second configuration of the EBD circuit enables modifications to the EBD circuit for influencing the transfer of the transmit signal and/or the receive signal through the EBD circuit at the expense of, in the case of the first configuration of the EBD circuit, a reduced isolation between the transmit port and the receive port at the second frequency, which is compensated for by the attenuation of the first filter, or, in the case of the second configuration of the EBD circuit, a reduced isolation between the transmit port and the receive port at the first frequency, which is compensated for by the attenuation of the second filter.

In an embodiment of the front-end module according to the present disclosure, in the first configuration, the EBD circuit is configured for reducing signal transfer from the transmit port towards the antenna port at the second frequency up to a predetermined level at which the attenuation by the first filter is still able to compensate for a reduced isolation between the transmit port and the receive port at the second frequency.

In an embodiment of the front-end module according to the present disclosure, in the second configuration, the EBD circuit is configured for reducing transmit signal losses from the transmit port towards the antenna port at the first frequency up to a predetermined level at which the attenuation by the second filter is still able to compensate for a reduced isolation between the transmit port and the receive port at the first frequency. In an example embodiment, the EBD circuit is configured for reducing transmit signal losses as such by benefiting power flow from the transmit port towards the antenna port at the first frequency.

In the first configuration of the EBD circuit, this embodiment may reduce the influence of the transmit signal on the receive signal at the second frequency, such that a cleaner receive signal at the second frequency is going from the antenna port towards the receive port, while the receive signal is still sufficiently free of any influence from a reduced isolation between the transmit port and the receive port at the second frequency, because of the attenuation by the first filter at the second frequency.

In the second configuration of the EBD circuit, this embodiment means that a stronger transmit signal at the first frequency is going from the transmit port towards the antenna port, while the receive signal at the receive port is still sufficiently free of any influence from a reduced isolation between the transmit port and the receive port at the first frequency, because of the attenuation by the second filter at the first frequency.

In an embodiment of the front-end module according to the present disclosure, in the first configuration of the EBD circuit, the tunable impedance circuit is configured for being tunable to balance its impedance with respect to the antenna impedance, i.e., the load impedance at the antenna port, at the first frequency in order to isolate the transmit port from the receive port at the first frequency. In the first configuration, the tunable impedance circuit is configured for reducing signal transfer from the transmit port towards the antenna port at the second frequency up to a predetermined level at which the attenuation by the first filter is still able to compensate for a reduced isolation between the transmit port and the receive port at the second frequency. In an example embodiment, the tunable impedance circuit is configured for reducing signal transfer as such by means of the impedance of the tunable impedance circuit being substantially larger than the antenna impedance, i.e., the load impedance at the antenna port, at the second frequency.

In an embodiment of the front-end module according to the present disclosure, in the second configuration of the EBD circuit, the tunable impedance circuit is configured for being tunable to balance its impedance with respect to the antenna impedance, i.e., the load impedance at the antenna port, at the second frequency in order to isolate the transmit port from the receive port at the second frequency. In the second configuration, the tunable impedance circuit is configured for reducing transmit signal losses from the transmit port towards the antenna port at the first frequency up to a predetermined level at which the attenuation by the second filter is still able to compensate for a reduced isolation between the transmit port and the receive port at the first frequency. In an example embodiment, the tunable impedance circuit is configured for reducing transmit signal losses as such by benefiting power flow from the transmit port towards the antenna port at the first frequency. In an example embodiment, the tunable impedance circuit is configured for reducing transmit signal losses as such by means of the impedance of the tunable impedance circuit being substantially larger than the antenna impedance, i.e., the load impedance at the antenna port, at the first frequency.

Configuring, in the first configuration of the EBD circuit, the tunable impedance circuit for both isolating the transmit port from the receive port at the first frequency and reducing signal transfer from the transmit port towards the antenna port at the second frequency, means that these operations are easily controlled by means of tuning the tunable impedance circuit.

Configuring, in the second configuration of the EBD circuit, the tunable impedance circuit for both isolating the transmit port from the receive port at the second frequency and reducing transmit signal losses from the transmit port towards the antenna port at the first frequency, means that these operations are easily controlled by means of tuning the tunable impedance circuit.

In an embodiment of the front-end module according to the present disclosure, in the first configuration of the EBD circuit, the tunable impedance circuit comprises a series connected third filter and a tunable impedance element. The third filter is configured for attenuating signals at the second frequency while allowing passage of signals at the first frequency.

In the second configuration of the EBD circuit, the tunable impedance circuit comprises a series connected third filter and a tunable impedance element. The third filter is configured for attenuating signals at the first frequency while allowing passage of signals at the second frequency.

The tunable impedance circuit, in the first configuration of the EBD circuit, comprising the series connected third filter for attenuating signals at the second frequency and the tunable impedance element, means that, at the first frequency, the tunable impedance circuit still has a large tuning range for balancing the impedance of the tunable impedance circuit with respect to the antenna impedance, i.e., the load impedance at the antenna port, at the first frequency in order to isolate the transmit port from the receive port at the first frequency, and means that at the second frequency the influence of the tuning of the tunable impedance element is reduced because of the attenuation by the third filter, which is beneficial for reducing signal transfer from the transmit port towards the antenna port.

The tunable impedance circuit, in the second configuration of the EBD circuit, comprising the series connected third filter for attenuating signals at the first frequency and the tunable impedance element, means that, at the second frequency, the tunable impedance circuit still has a large tuning range for balancing the impedance of the tunable impedance circuit with respect to the antenna impedance, i.e., the load impedance at the antenna port, at the second frequency in order to isolate the transmit port from the receive port at the second frequency, and means that at the first frequency the influence of the tuning of the tunable impedance element is reduced because of the attenuation by the third filter, which is beneficial for reducing the transmit signal losses from the transmit port towards the antenna port at the first frequency.

In an embodiment of the front-end module according to the present disclosure, the hybrid transformer is skewed towards the antenna port by means of an input tap which is positioned closer towards the antenna port in order to reduce transmit signal losses.

In an embodiment of the front-end module according to the present disclosure, the hybrid transformer is skewed towards the balance port, thus towards the tunable impedance circuit, by means of an input tap which is positioned closer towards the balance port in order to reduce receive signal losses.

In an embodiment of the front-end module according to the present disclosure, the EBD circuit is configured for reducing signal transfer from the transmit port towards the antenna port at at least one further frequency. In an example embodiment, the at least one further frequency is different from both the first frequency and the second frequency. In an example embodiment, the at least one further frequency is chosen at a frequency of an unwanted spurious component in the transmit signal. This embodiment suppresses unwanted components in the transmit signal at the at least one further frequency from going from the transmit port towards the antenna port and thus the antenna.

In an embodiment of the front-end module according to the present disclosure, the tunable impedance circuit is configured for reducing signal transfer from the transmit port towards the antenna port at at least one further frequency. In an example embodiment, the at least one further frequency is different from both the first frequency and the second frequency. In an example embodiment, the at least one further frequency is chosen at a frequency of an unwanted spurious component in the transmit signal. This embodiment suppresses unwanted components in the transmit signal at the at least one further frequency from going from the transmit port towards the antenna port and thus the antenna.

In an embodiment of the front-end module according to the present disclosure, the tunable impedance circuit comprises a series connected third filter and a tunable impedance element. The third filter is configured for attenuating signals at the at least one further frequency. This embodiment suppresses unwanted components in the transmit signal at the at least one further frequency from going from the transmit port towards the antenna port and thus the antenna.

Furthermore, the present disclosure provides a telecommunication device comprising the front-end module according to the present disclosure.

Furthermore, it is an aim of the present disclosure to provide a method for operating a front-end module, FEM, for a telecommunication device comprising an electrical balance duplexer circuit, which method enables a better isolation of a signal to be transmitted and a signal to be received.

This aim is achieved according to the present disclosure with a method showing the technical characteristics of the second independent claim.

Therefore, the present disclosure provides a method for operating a front-end module, FEM, for a telecommunication device. The front-end module comprises an electrical balance duplexer, EBD, circuit. The EBD circuit comprises a hybrid transformer configured for being coupled via a transmit port to the telecommunication device to input a transmit signal comprising a signal to be transmitted at a first frequency from the telecommunication device, via an antenna port to an antenna of the telecommunication device, via a receive port to the telecommunication device to output a receive signal comprising a signal to be received at a second frequency to the telecommunication device, and via a balance port to a tunable impedance circuit which is part of the EBD circuit. In an example embodiment, the second frequency is different from the first frequency. The EBD circuit is configured according to one of a first configuration and a second configuration.

In the first configuration the EBD circuit is configured to isolate the transmit port from the receive port at the first frequency. In the case of the first configuration of the EBD circuit, the method comprises the steps of inputting an input transmit signal in the EBD circuit from the telecommunication device via the transmit port, attenuating the input transmit signal with a predetermined amount at the second frequency by means of a first filter at the transmit port, inputting a receive signal in the EBD circuit from the antenna via the antenna port, isolating the transmit port from the receive port at the first frequency by tuning the tunable impedance circuit, outputting the attenuated input transmit signal to the antenna via the transmit port, and outputting the isolated input receive signal to the telecommunication device via the receive port.

In the second configuration, the EBD circuit is configured to isolate the transmit port from the receive port at the second frequency. In the case of the second configuration of the EBD circuit, the method comprises the steps of inputting a transmit signal in the EBD circuit from the telecommunication device via the transmit port, inputting a receive signal in the EBD circuit from the antenna via the antenna port, isolating the transmit port from the receive port at the second frequency by tuning the tunable impedance circuit, attenuating the isolated input receive signal with a predetermined amount at the first frequency by means of a second filter at the receive port, outputting the isolated input transmit signal to the antenna via the transmit port, and outputting the attenuated input receive signal to the telecommunication device via the receive port.

In an embodiment of the method according to the present disclosure, in the case of the first configuration of the EBD circuit, the method further comprises the step of operating the EBD circuit for reducing signal transfer from the transmit port towards the antenna at the second frequency up to a predetermined level at which the attenuation by the first filter is still able to compensate for a reduced isolation between the transmit port and the receive port at the second frequency.

In an embodiment of the method according to the present disclosure, in the case of the second configuration of the EBD circuit, the method further comprises the step of operating the EBD circuit for reducing introduced input transmit signal losses from the transmit port towards the antenna port at the first frequency up to a predetermined level at which the attenuation by the second filter is still able to compensate for a reduced isolation between the transmit port and the receive port at the first frequency.

In an embodiment of the method according to the present disclosure, in the case of the first configuration of the EBD circuit, the method further comprises the step of tuning the impedance of the tunable impedance circuit to balance the impedance of the tunable impedance circuit with respect to the antenna impedance, i.e., the load impedance at the antenna port, at the first frequency, in order to isolate the transmit port from the receive port at the first frequency.

In an embodiment of the method according to the present disclosure, in the case of the first configuration of the EBD circuit, the method further comprises the step of tuning the impedance of the tunable impedance circuit for reducing signal transfer from the transmit port towards the antenna port at the second frequency up to a predetermined level at which the attenuation by the first filter is still able to compensate for a reduced isolation between the transmit port and the receive port at the second frequency. In an example embodiment, the step of tuning the impedance of the tunable impedance circuit for reducing signal transfer as such is performed by increasing the impedance of the tunable impedance circuit to be substantially larger than the antenna impedance, i.e., the load impedance at the antenna port, at the second frequency.

In an embodiment of the method according to the present disclosure, in the case of the second configuration of the EBD circuit, the method further comprises the step of tuning the impedance of the tunable impedance circuit to balance the impedance of the tunable impedance circuit with respect to the antenna impedance, i.e., the load impedance at the antenna port, at the second frequency, in order to isolate the transmit port from the receive port at the second frequency. In the case of the second configuration of the EBD circuit, the method further comprises the step of tuning the impedance of the tunable impedance circuit for reducing input transmit signal losses from the transmit port towards the antenna port at the first frequency up to a predetermined level at which the attenuation by the second filter is still able to compensate for a reduced isolation between the transmit port and the receive port at the first frequency. In an example embodiment, the step of tuning the impedance of the tunable impedance circuit for reducing input transmit signal losses as such is performed by benefiting power flow from the transmit port towards the antenna port at the first frequency. In an example embodiment, the step of tuning the impedance of the tunable impedance circuit for reducing input transmit signal losses as such is performed by increasing the impedance of the tunable impedance circuit to be substantially larger than the antenna impedance, i.e., the load impedance at the antenna port, at the first frequency.

In an embodiment of the method according to the present disclosure, in the case of the first configuration of the EBD circuit, the step of tuning the impedance of the tunable impedance circuit for reducing signal transfer from the transmit port towards the antenna port at the second frequency is performed by means of a third filter in the tunable impedance circuit which is configured for attenuating signals at the second frequency while allowing passage of signals at the first frequency.

In an embodiment of the method according to the present disclosure, in the case of the second configuration of the EBD circuit, the step of tuning the impedance of the tunable impedance circuit for reducing the input transmit signal losses from the transmit port towards the antenna port at the first frequency is performed by means of a third filter in the tunable impedance circuit which is configured for attenuating signals at the first frequency while allowing passage of signals at the second frequency.

In an embodiment of the method according to the present disclosure, the method further comprises the step of operating the EBD circuit for reducing signal transfer from the transmit port towards the antenna at at least one further frequency. In an example embodiment, the at least one further frequency is different from both the first frequency and the second frequency. In an example embodiment, the at least one further frequency is chosen at a frequency of an unwanted spurious component in the transmit signal.

In an embodiment of the method according to the present disclosure, the method further comprises the step of tuning the impedance of the tunable impedance circuit for reducing signal transfer from the transmit port towards the antenna port at at least one further frequency. In an example embodiment, the at least one further frequency is different from both the first frequency and the second frequency. In an example embodiment, the at least one further frequency is chosen at a frequency of an unwanted spurious component in the transmit signal.

In an embodiment of the method according to the present disclosure, the step of tuning the impedance of the tunable impedance circuit for reducing signal transfer from the transmit port towards the antenna port at the at least one further frequency is performed by means of a third filter in the tunable impedance circuit which is configured for attenuating signals at the at least one further frequency.

BRIEF DESCRIPTION OF THE FIGURES

The above, as well as additional, features will be better understood through the following illustrative and non-limiting detailed description of example embodiments, with reference to the appended drawings.

The disclosure will be further elucidated by means of the following description and the appended figures.

Figure 1:
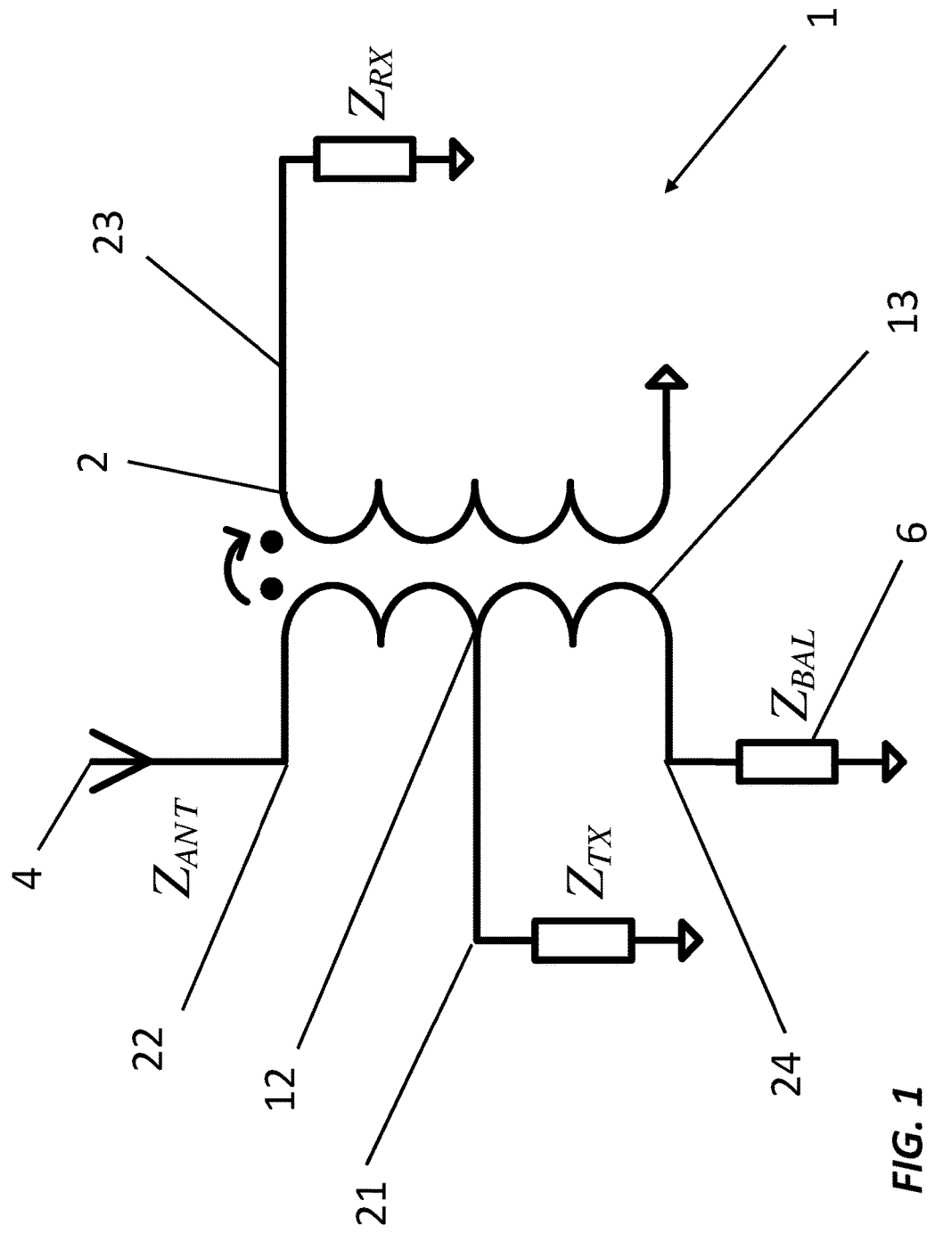
FIG. 1 shows an hybrid transformer of the prior art.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

FIG. 1 illustrates a known electrical-balance duplexer, EBD, circuit 1 in which a hybrid transformer 2 is configured to have a transmit port 21 connected to an input tap 12 of a primary winding 13 of the hybrid transformer 2 and a transmit, TX, circuit (indicated by impedance $Z_{TX}$), a receive, RX, port 23 connected to a receive circuit (indicated by impedance $Z_{RX}$), an antenna port 22 connected to an antenna 4, and, a balance port 24 connected to a balance network (indicated by $Z_{BAL}$) acting as a terminating port or dummy load.

Figure 2:
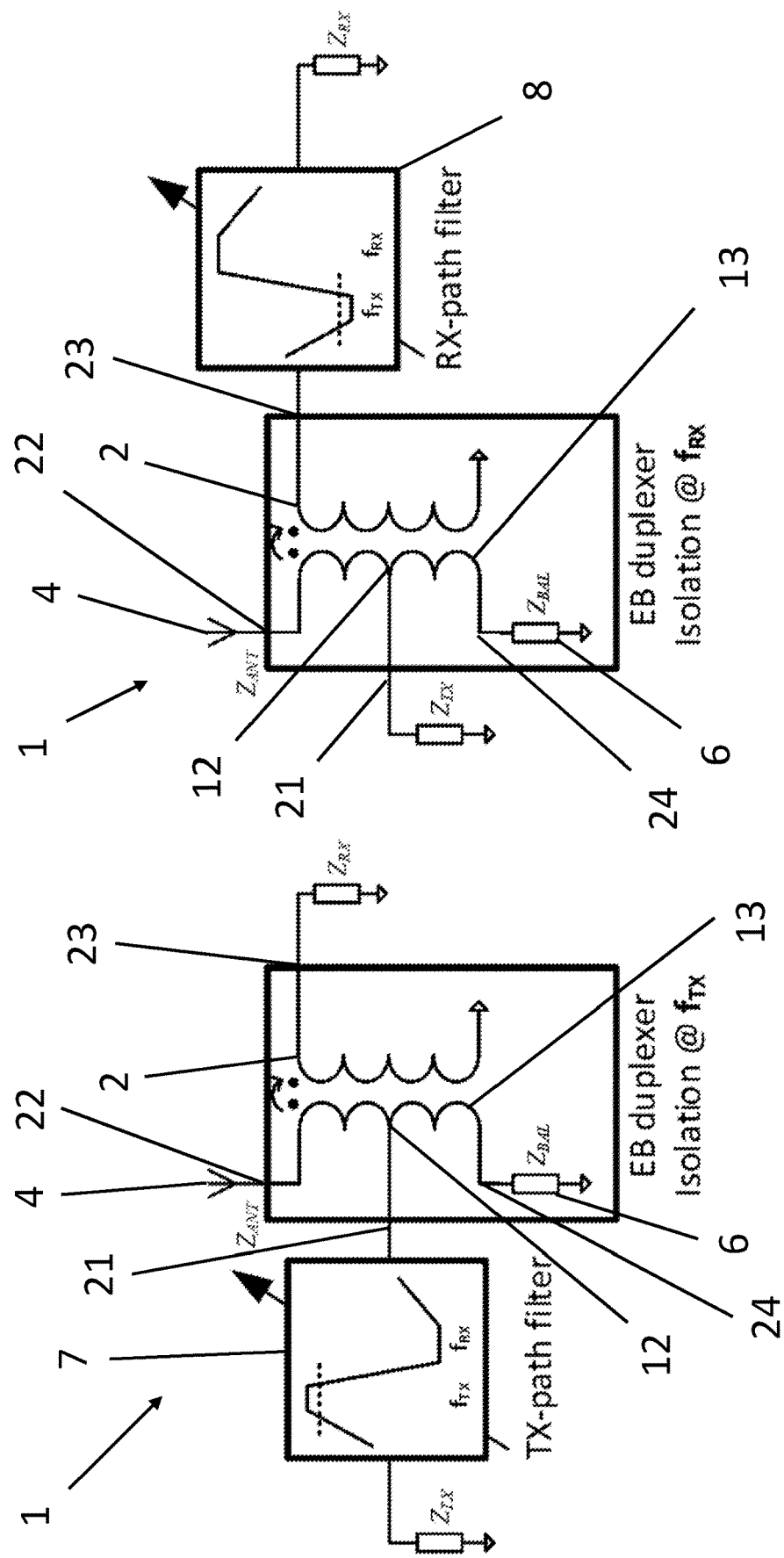
FIG. 2A shows an embodiment of an EBD circuit according to a first configuration, according to an example embodiment.
FIG. 2B shows an embodiment of an EBD circuit according to a second configuration, according to an example embodiment.

This disclosure deals with an alternative method that could enable a tunable frequency-division-duplexing, FDD, capable front-end-module, FEM. Components which have been described above with reference to FIG. 1 have the same reference numerals. It is proposed to use an electrical-balance duplexer, EBD, circuit 1, at a first frequency for transmitting, combined with a first filter 7 at the transmit, TX, port 21 having a stop-band frequency at a second frequency for receiving, such as shown in FIG. 2A, or an EBD circuit 1 at the second frequency, combined with a second filter 8 at the receive, RX, port 23 having a stop-band frequency at the first frequency, such as shown in FIG. 2B.

When such a first filter 7 or second filter 8 is present, the EBD isolation requirement at the stop-band frequency of the respective filter 7, 8 is relaxed. Typically, 50 dB is required. For example, if the filter 7, 8 can achieve 40 dB of attenuation, then the EBD 1 still needs to guarantee at least 10 dB of attenuation.

The benefits of this alternative method are:
reduced complexity required in the design of the tunable impedance circuit 6, i.e., the balance network $Z_{BAL}$ 6, of the EBD circuit 1, because now only 50 dB of isolation needs to be provided at a single frequency since the filter 7, 8 takes care of the other frequency,
reduced complexity of the tuning algorithm,
reduced convergence time for the tuning algorithm,
reduced area of the balance network $Z_{BAL}$ 6, and
increased linearity of the EBD circuit 1.

A typical EBD implementation with an ideal hybrid transformer 2 has at least 3 dB loss at the TX and RX frequencies both, as the power splits between the antenna 4 and $Z_{BAL}$ 6 in the TX case and between the TX port 21 and the RX port 23 in the RX case. In reality, the hybrid transformer 2 usually still adds a bit more loss. Ideally, the loss needs to be reduced to as low as possible. A known technique to do this is skewing of the hybrid transformer 2, where the position of the input tap 12 is changed, to trade-off TX loss for RX loss (and note that RX loss=RX Noise Figure, NF).

The main technical problem with this skewing technique is, however, that it can only trade off for loss in the alternative path, i.e., TX for RX or RX for TX.

In this disclosure, a new technique is proposed to optimize the loss of the EBD circuit 1, allowing a trade-off with isolation instead. For example, the use of the second filter 8 at the RX port 23, such as shown in FIG. 2B, allows reduction of the isolation of the EBD circuit 1 at the TX frequency, i.e., the first frequency, which allows us to pay for the trade-off when using this new technique.

This novel technique adapts the impedance of the balance network $Z_{BAL}$ 6 at the TX frequency in FIG. 2B instead of the hybrid transformer 2. The power split that is normally 50-50 between $Z_{ANT}$ 4 and $Z_{BAL}$ 6 is changed to e.g., 30-70 or 20-80 when $Z_{BAL}$ 6 is chosen to be >50 Ohm at the TX frequency. In that case, less TX loss results, while the isolation at the TX frequency simultaneously degrades. Using a filter 9, such as for example shown in FIG. 10A, in the balance network, allows to maintain a 50 Ohm at the RX frequency, i.e., the second frequency, so that the EBD circuit 1 can still provide a high isolation at the RX frequency.

Vice versa, when the architecture of FIG. 2A is used, the impedance of the balance network $Z_{BAL}$ 6 can be adapted to reduce signal transfer from the transmit port 21 towards the antenna port 22 at the RX frequency at the cost of isolation, which the first filter 7 at the TX path takes care of. This, while maintaining isolation at the TX frequency through EBD isolation by means of signal cancellation within the hybrid transformer 2. In that case, a lower impedance is offered at the RX frequency. Similarly to the TX case this can be implemented through the use of a filter 9 in the balance network $Z_{BAL}$ 6.

This novel concept aims to break the traditional trade-off between TX and RX insertion loss when the hybrid transformer 2 is skewed. In the traditional case, either TX or RX loss can be improved at the cost of degraded losses in the alternative path, because of the reciprocal operation of the hybrid transformer 2, i.e., when the hybrid transformer 2 is skewed towards the antenna 4, the TX loss improves as the impedance $Z_{BAL}$ of the balance network 6 must be increased to maintain a balance condition, but the RX loss increases because the effective impedance the TX now offers to the antenna 4 is lower and the prior 50-50 power split becomes higher towards the TX, such that the RX loss increases.

In the concept according to the present disclosure, instead of only skewing the hybrid transformer 2 itself to benefit RX loss, the balance network $Z_{BAL}$ 6 itself offers a different impedance at the TX and RX frequencies to improve losses at the TX frequency as well, while providing a balance condition at the RX frequency. This is enabled first of all by the second filter 8 at the RX port 23 as described above with reference to FIG. 2B, which allows an impedance offset between the two frequencies, but most importantly needs impedance matching in order to ensure the impedance at the TX frequency is always higher than the 50-50 split case would dictate, such that the split benefits TX loss.

In summary, the hybrid transformer 2 is skewed to benefit RX loss, while a filter 9 in the balance network 6 enables an impedance adaptation towards a higher impedance at the TX frequency, whereby the TX loss is improved without degrading RX loss.

Figure 7:
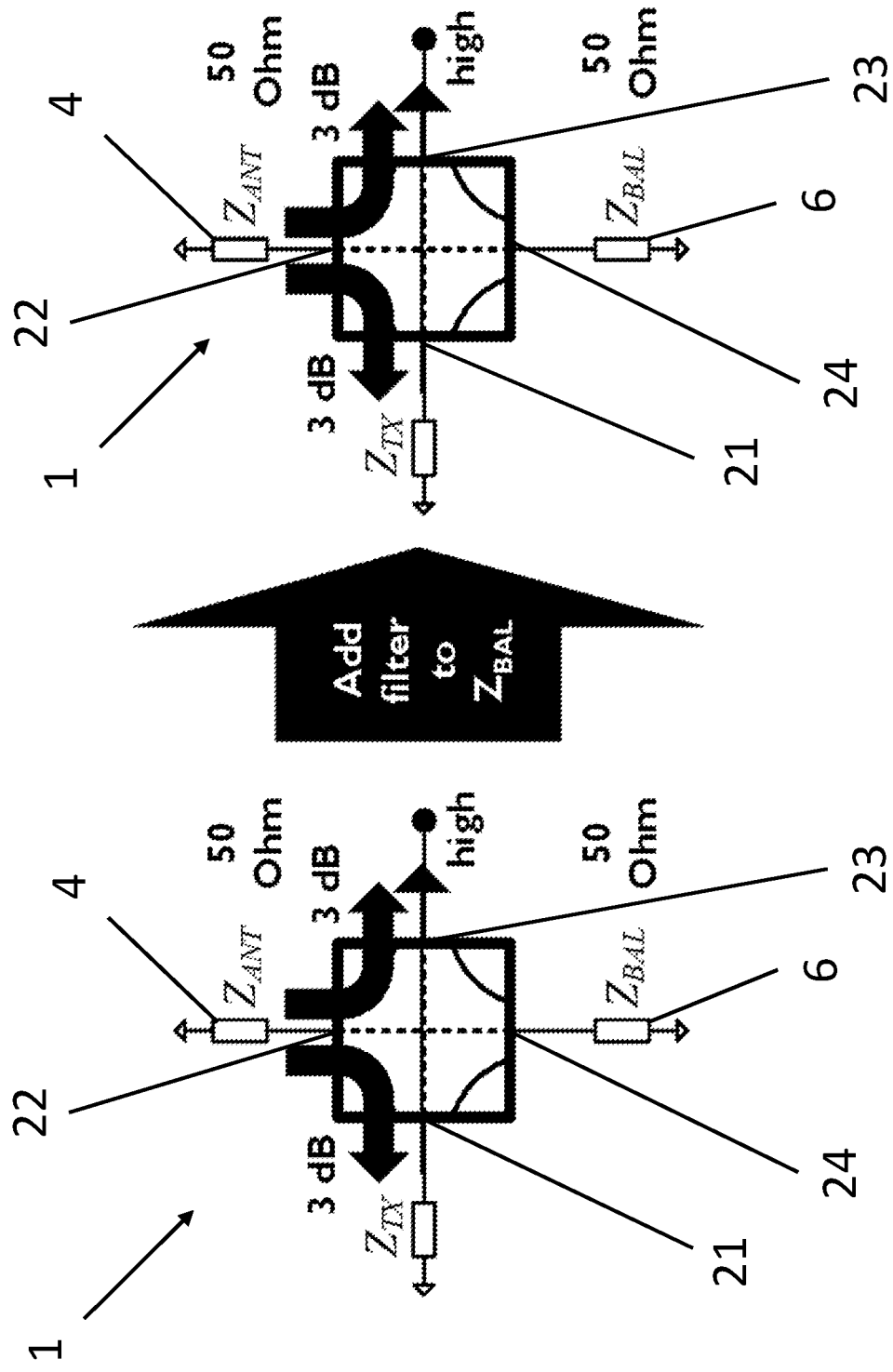
FIG. 7 shows the influence at the second frequency of the tunable impedance circuit comprising a third filter in combination with the tunable impedance element on the operation of the EBD circuit of FIG. 3, according to an example embodiment.
Figure 8:
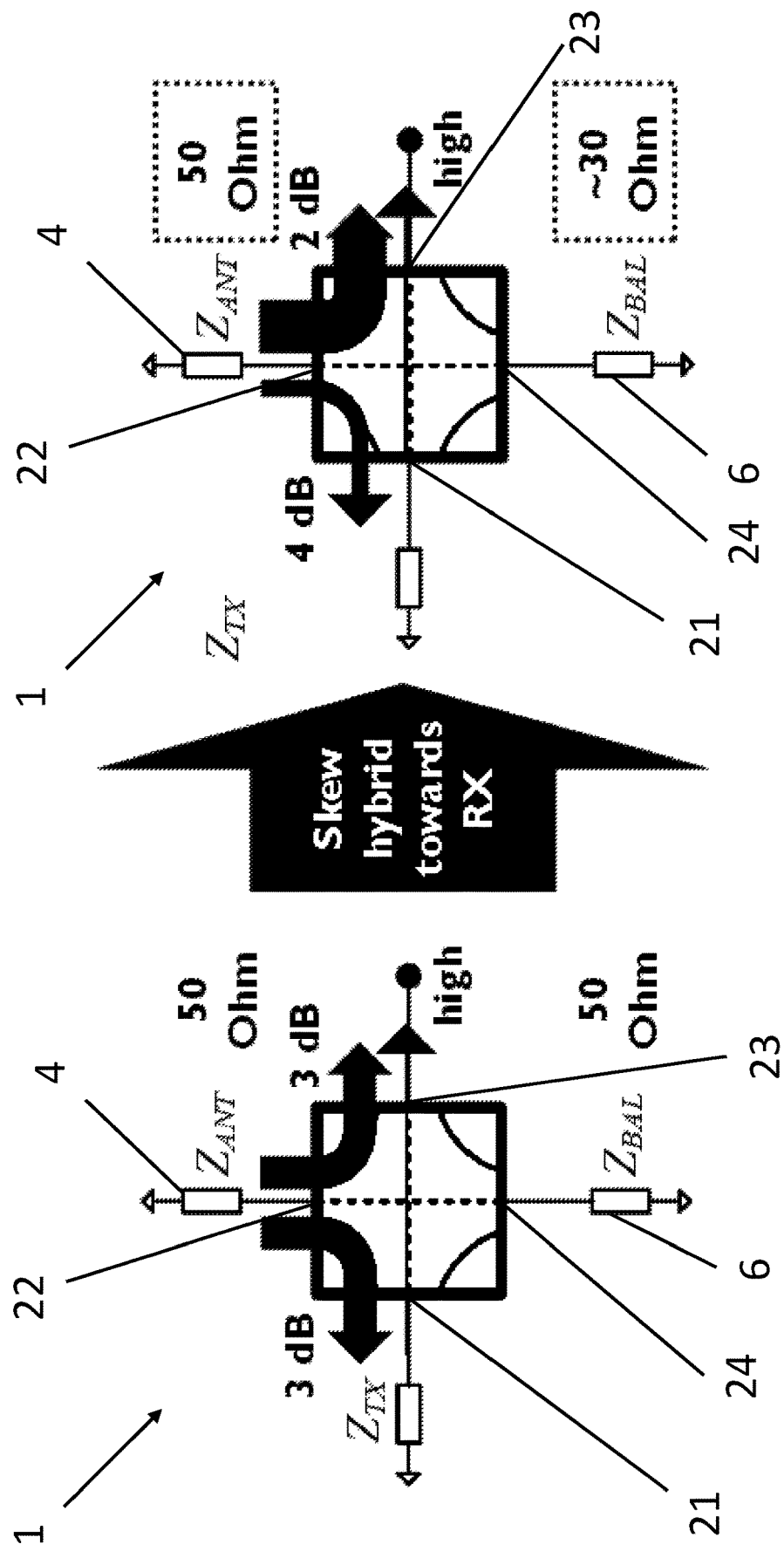
FIG. 8 shows the influence at the second frequency of the hybrid transformer skewed towards the tunable impedance circuit on the operation of the EBD circuit of FIG. 7, according to an example embodiment.

Consider the more visual approach in the FIGS. 3, 4, and 6 demonstrating the operation at the TX frequency of the EBD circuit 1 according to an embodiment of the present disclosure, and the FIGS. 3, 7, and 8 demonstrating the operation at the RX frequency of the EBD circuit 1, together with the summary in Table 1 below.

Figure 3:
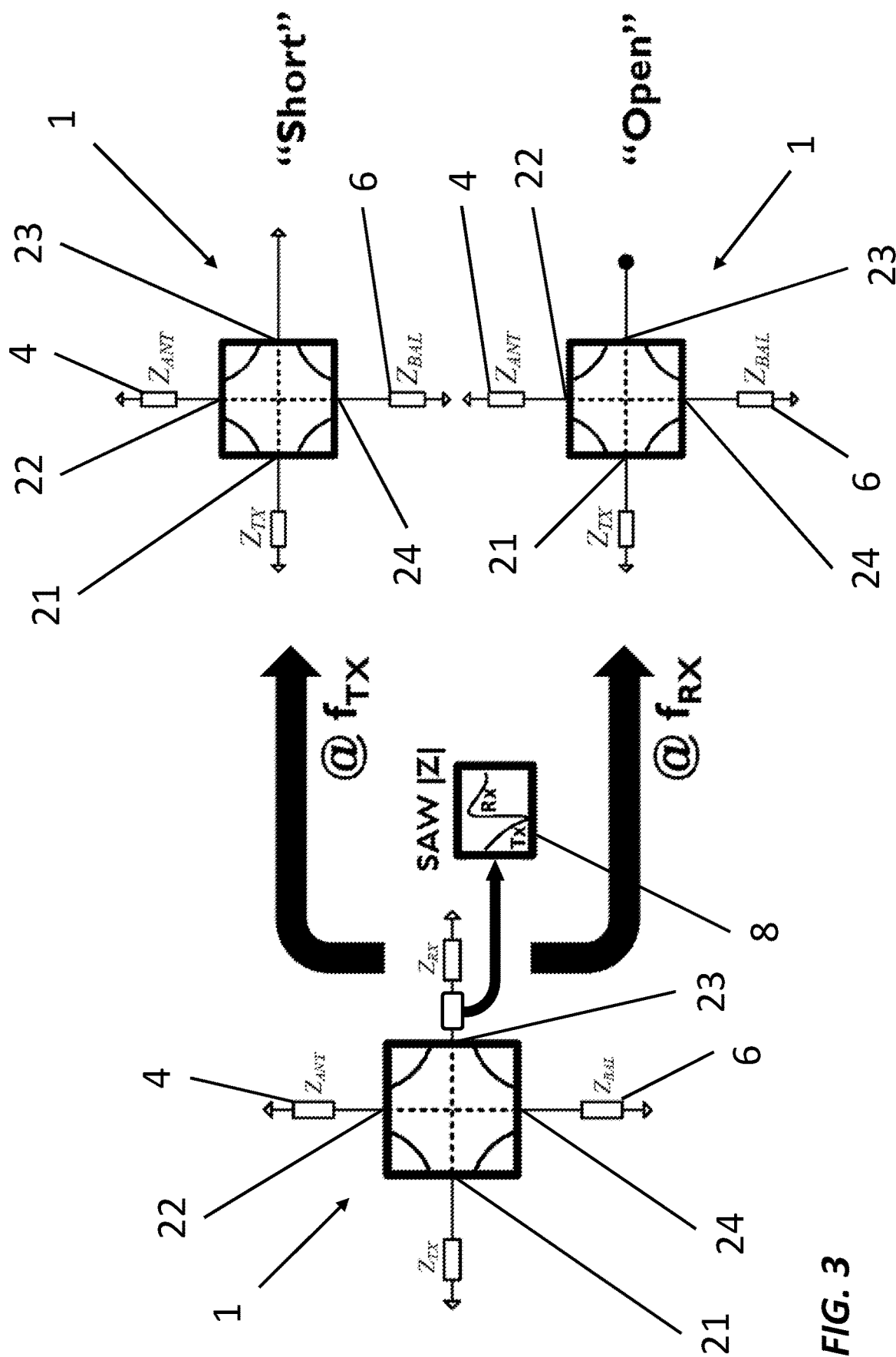
FIG. 3 shows the influence of the second filter on the operation of an EBD circuit according to the second configuration, at both the first frequency and the second frequency, according to an example embodiment.
Figure 4:
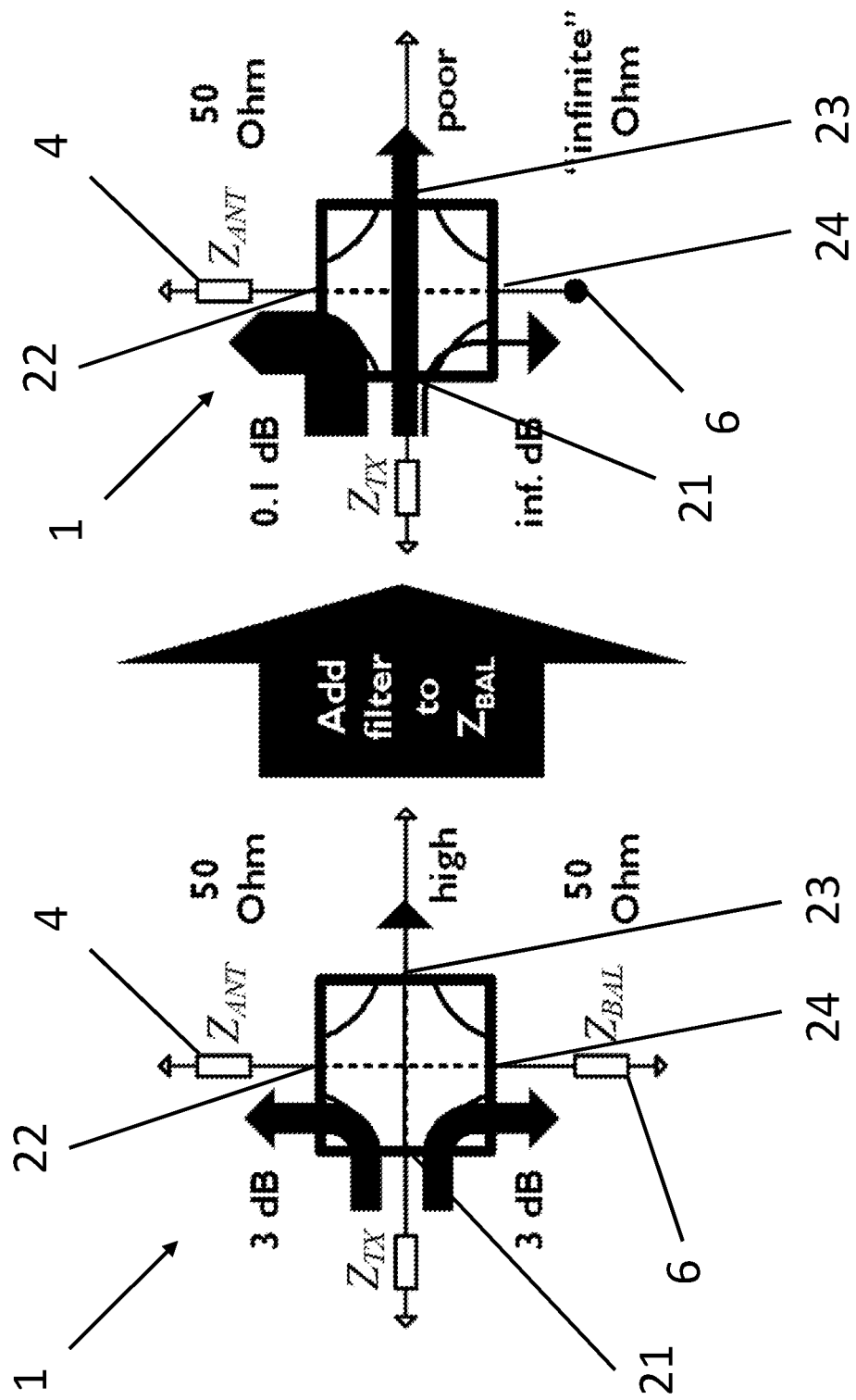
FIG. 4 shows the influence at the first frequency of a tunable impedance circuit comprising a third filter in combination with a tunable impedance element on the operation of the EBD circuit of FIG. 3, according to an example embodiment.

In FIG. 3, the traditional hybrid transformer 2 configuration is shown as connected to its four ports 21, 22, 23, 24. The difference with respect to a normal source/load termination scheme is that the RX port 23 is now implemented using the second filter 8 that provides a low impedance at the TX frequency and a high impedance at the RX frequency. The second filter 8 essentially creates a low impedance or "short" at the TX frequency and a high impedance or "open" at the RX frequency. At the RX frequency then, for low RX loss, a high impedance match must be made, which may be done in practice by using an X:1 up-conversion transformer.

For the purpose of explaining how the technique according to the present disclosure can be implemented to benefit both RX and TX insertion loss simultaneously, the changes from this normal source/load termination scheme will be made step-by-step and the impact on loss and isolation will be evaluated conceptually in FIGS. 4 and 6 for the TX frequency and in FIGS. 7 and 8 for the RX frequency.

In step 1, a stop-band filter 9 is introduced in the tunable impedance circuit 6, i.e., the balance network $Z_{BAL}$ 6. At the TX frequency, consider the normal situation shown in FIG. 4 on the left, where the TX signal splits up 50-50, or equivalently has 3 dB loss towards the antenna 4 and towards the balance network 6, which both present a 50 Ω termination. Instead of a 50 Ω termination, consider now the right hand-side, which represents the case where a filter 9 is added to the balance network 6. At the TX frequency, the impedance is significantly higher than 50 Ω—for simplicity consider it open.

Figure 5:
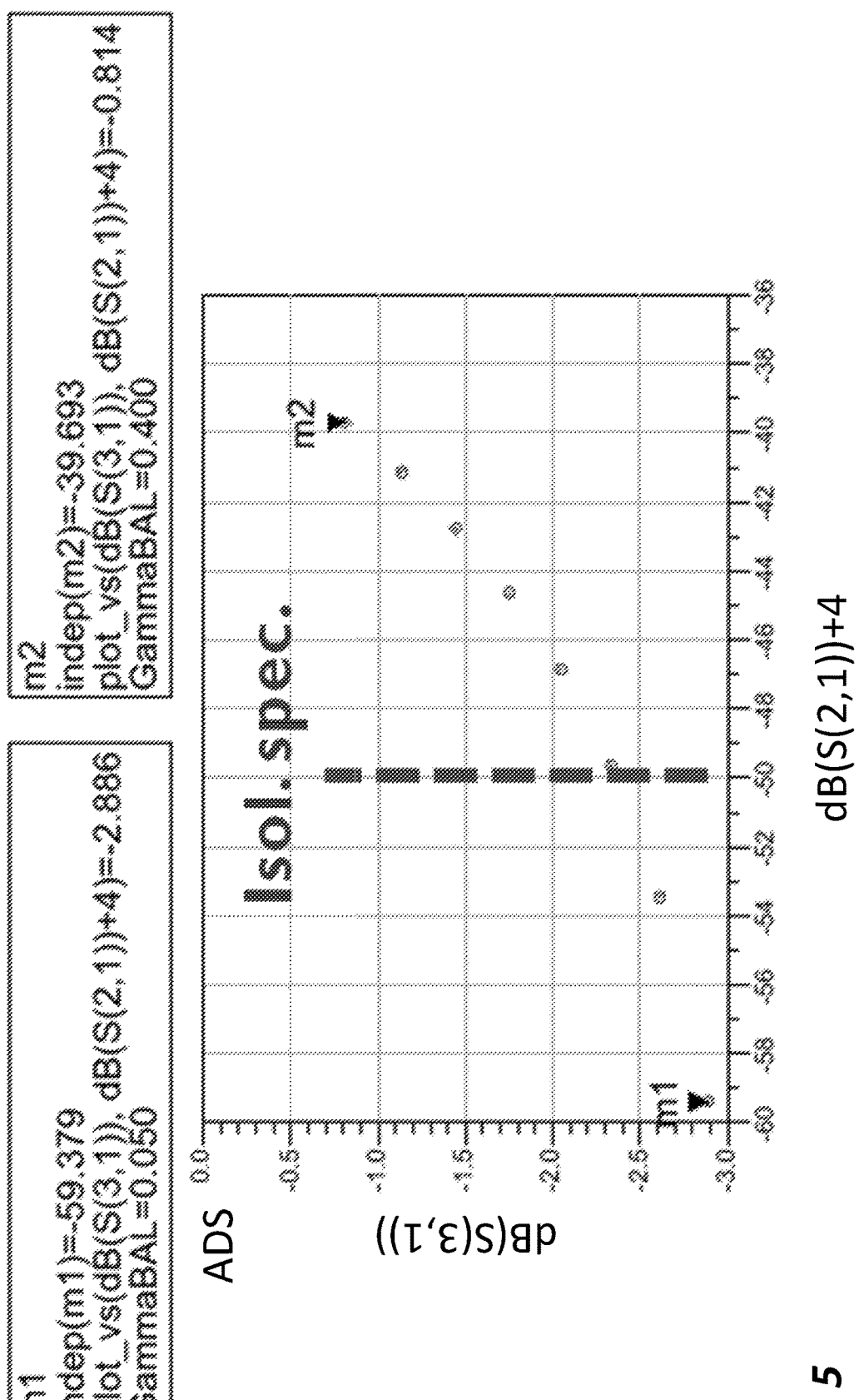
FIG. 5 shows a plot of the relation between the transmit signal loss and the isolation between the transmit port and the receive port at different impedances of the tunable impedance circuit, according to an example embodiment.

Now, isolation is degraded, but all of the TX signal energy is split between the antenna 4 and the RX port 23, leading to a very low TX loss but also a very poor isolation. For 'normal' dual-frequency hybrid transformer 2 operation, such impedance offsets cannot be sustained because the isolation requirement is very high, being >50 dB at the TX frequency. However, in this case, a surface acoustic wave, SAW, filter 8 provides 40 dB of filtering. Therefore, only 10 dB of filtering needs to be guaranteed. Thus, there will be a trade-off between the isolation and TX loss, given by the impedance offset the $Z_{BAL}$-filter 9 can provide. Consider the plot of TX loss (Y-axis) versus TX-to-RX isolation (X-axis) shown in FIG. 5 for the final hybrid transformer 2 with the SAW filter 8 and low noise amplifier, LNA, (not shown) connected to the RX port 23, and to the balance network 6. The reflection coefficient $\Gamma_{BAL}$ of the balance network $Z_{BAL}$ 6 is tuned from 0.05 (very close to 50 Ω) to 0.4 (significantly increased). This plot is indicative of the isolation/loss trade-off that can be observed when the balance network $Z_{BAL}$ 6 is designed for an increased impedance at the TX frequency, e.g., by using a filter 9.

Figure 6:
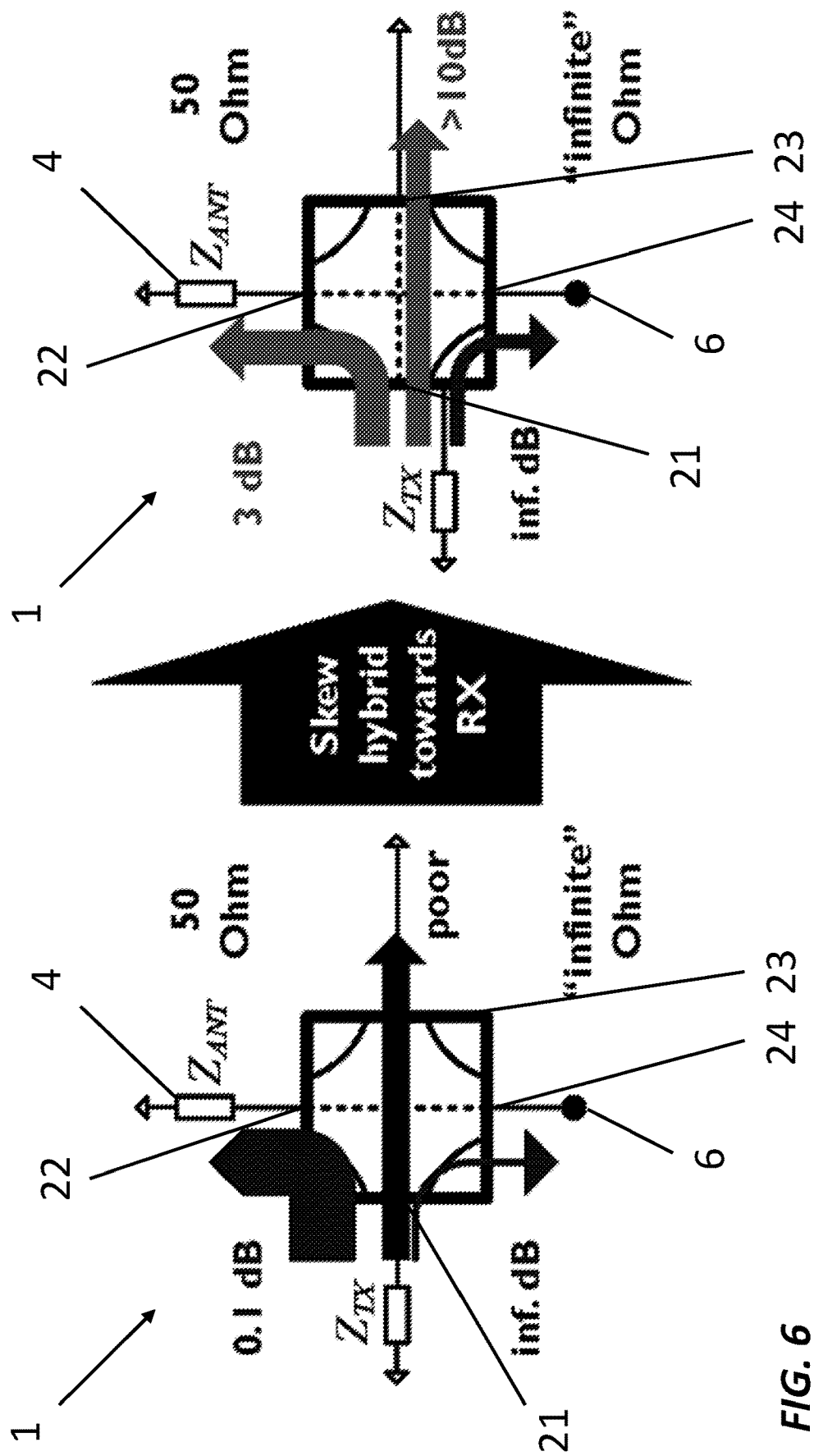
FIG. 6 shows the influence at the first frequency of a hybrid transformer skewed towards the tunable impedance circuit on the operation of the EBD circuit of FIG. 4, according to an example embodiment.

In step 2, the hybrid transformer 2 itself is skewed, as in the traditional case, by offsetting the input tap 12 of the primary winding 13, as can be seen in FIG. 6. Through this traditional winding-skewing, naturally the trade-off between TX loss and isolation is changed from the previous situation: TX loss is degraded and isolation is improved.

Now, consider what the influence is of these two steps at the RX frequency.

In step 1, a filter 9 was added to the tunable impedance circuit 6, i.e., the balance network $Z_{BAL}$ 6, which at the RX frequency is a simple pass-network. Therefore, it has no influence on the impedance tuning condition at the RX frequency. It still offers ~50 Ω at that frequency to provide impedance balancing up to 50 dB accuracy such that >50 dB of isolation is achieved in the EBD circuit 1 at the RX frequency, such as can be seen in FIG. 7.

In step 2, the primary winding 13 of the hybrid transformer 2 is skewed towards the balance network $Z_{BAL}$ 6. In order to maintain a balance condition between the impedance $Z_{BAL}$ of the balance network 6 and the impedance $Z_{ANT}$ of the antenna 4 at the RX frequency, which implies the impedance $Z_{BAL}$ of the balance network 6 needs to be lowered with respect to the impedance $Z_{ANT}$ of the antenna 4. Thereby, the overall noise figure will improve, because $4kTR_{BAL}$, the $Z_{BAL}$ noise contribution that degrades the NF by 3 dB in the default operation conditions, is now lower ($R_{BAL}$<50 Ω), such that the NF degrades by less than 3 dB. Similarly, due to the reciprocity of the hybrid transformer 2, the loss in the RX path will also improve. This is shown in FIG. 8.

TABLE 1

Concept summary.

| Parameter | Default hybrid conditions | | Step 1 Adapting $Z_{BAL}$ by adding filter in $Z_{BAL}$ | | Step 2 Skewing the hybrid | |
| --- | --- | --- | --- | --- | --- | --- |
| | @ $f_{TX}$ | @ $f_{RX}$ | @ $f_{TX}$ | @ $f_{RX}$ | @ $f_{TX}$ | @ $f_{RX}$ |
| TX-RX isolation (dB) | 50 | 50 | <<50 | 50 | <50 (>10) | 50 |
| TX loss (dB) | 3 | 3 | <3 | 3 | 3 | >3 |
| RX loss (dB) | 3 | 3 | 3 | 3 | <3 | <3 |
| RX NF (dB) | 3 | 3 | Very high | 3 | Very high | <3 |
| $Z_{BAL}$ (Ω) | 50 | 50 | "open" | 50 | "open" | ~30 |
| $Z_{ANT}$ (Ω) | 50 | 50 | 50 | 50 | 50 | 50 |

Note that, in order for this $Z_{BAL}$ adaptation technique to work, a large $Z_{RX}$-delta is required, i.e., the load impedance rotation from the TX frequency to the RX frequency at the RX port 23. In this case, the second filter 8 provides this, but this technique could generally also be applied to circuits that use different methods to provide this $Z_{RX}$-delta.

Furthermore, this technique requires a filter and matching network in $Z_{BAL}$, which have to be tuned to each band. This can be done in a coarsely tuned manner, e.g., the main balancing to get >50 dB accuracy is done for the RX frequency. At the TX frequency, the matching network and filter could be set using a look-up-table, if calibrated impedance and transfer function measurements are available for the matching network and filter inside $Z_{BAL}$. Lacking that, the TX loss can be used as a measure when tuning all components in the balance network for a smart algorithm in a co-optimization approach of loss and isolation, tuning the matching network and filter in an adaptive manner.

Implementing a Filter 9 in the Balance Network $Z_{BAL}$ 6

Figure 9:
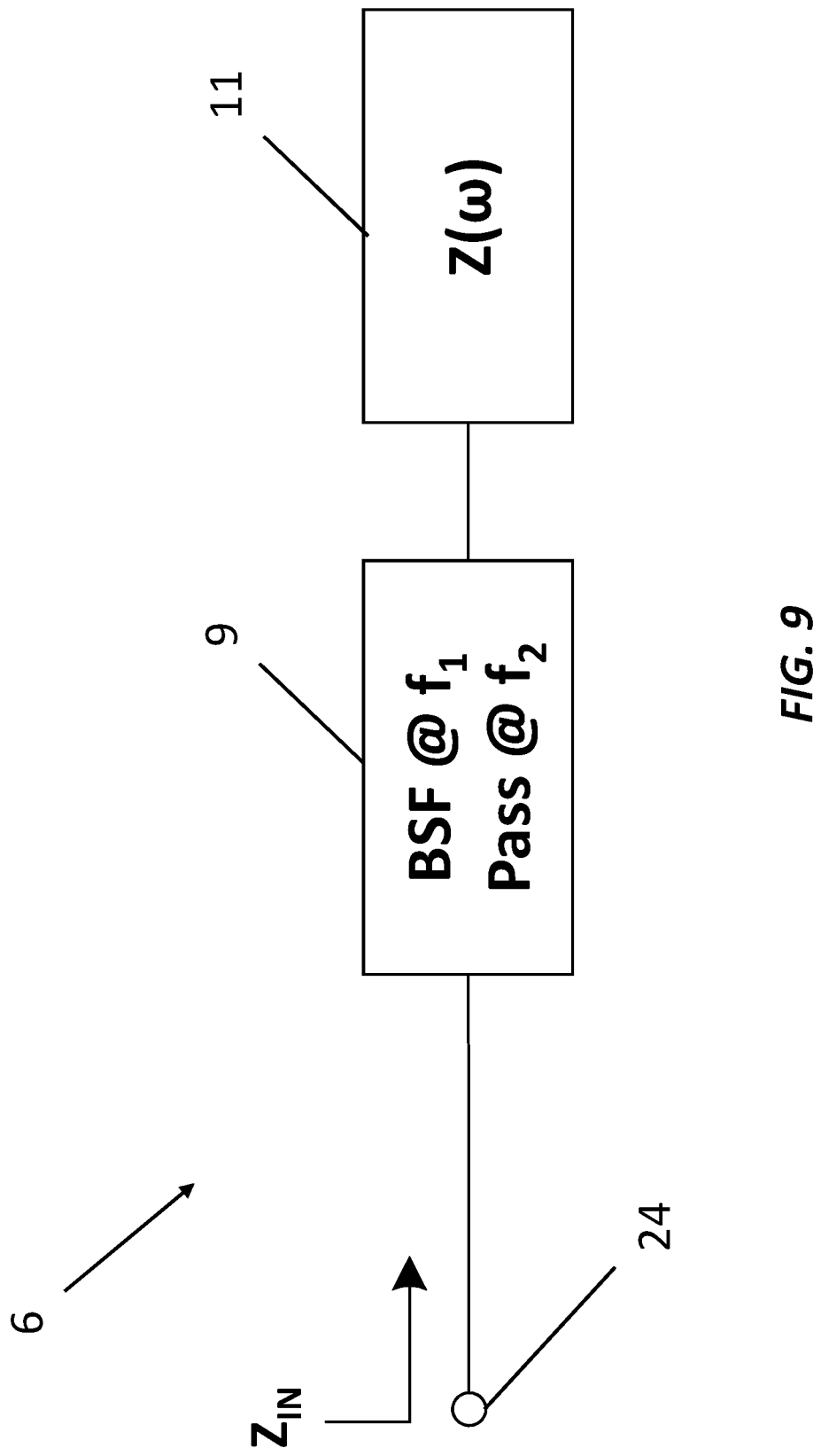
FIG. 9 shows a block representation of a series connected third filter and a tunable impedance element for use in a tunable impedance circuit of an EBD circuit according to the second configuration, according to an example embodiment.

Full tuning capability is required for the RX frequency, where the EBD circuit 1 is operating to balance with the antenna 4. On the other hand, accurate electrical balance is not required at the TX frequency, but at least 10 dB of isolation at the TX frequency should be guaranteed. Therefore, assuming that an antenna tuner brings the impedance $Z_{ANT}$ of the antenna 4 to 50 Ω at the TX frequency, for example, with a certain maximum variation specification, the isolation at that frequency could be limited if the impedance $Z_{BAL}$ of the balance network 6 does not vary much from the same 50 Ω point. Basically, the variability at the TX frequency needs to be limited, while maintaining a large tuning range at the RX frequency. Recall the filter operation above with a single stop-band filter 9 instead, which avoids tuning the impedance at the stop-band frequency, but only at the pass-band frequency (see FIG. 9).

Now, at the pass-frequency ($f_2=f_{RX}$), it is possible to tune $Z_{IN}$ by adapting the impedance, $Z(\omega)$, in a wideband translator 11. In the stop-band ($f_1=f_{TX}$), changes in $Z(\omega)$ will be seen much less due to the attenuation (e.g., the sum $S_{21}+S_{12}$ of the scattering parameters). In that way, even a little bit of filtering (for example, 2-4 dB) can already achieve much reduction of impedance variations at $f_1$.

Figure 10A:
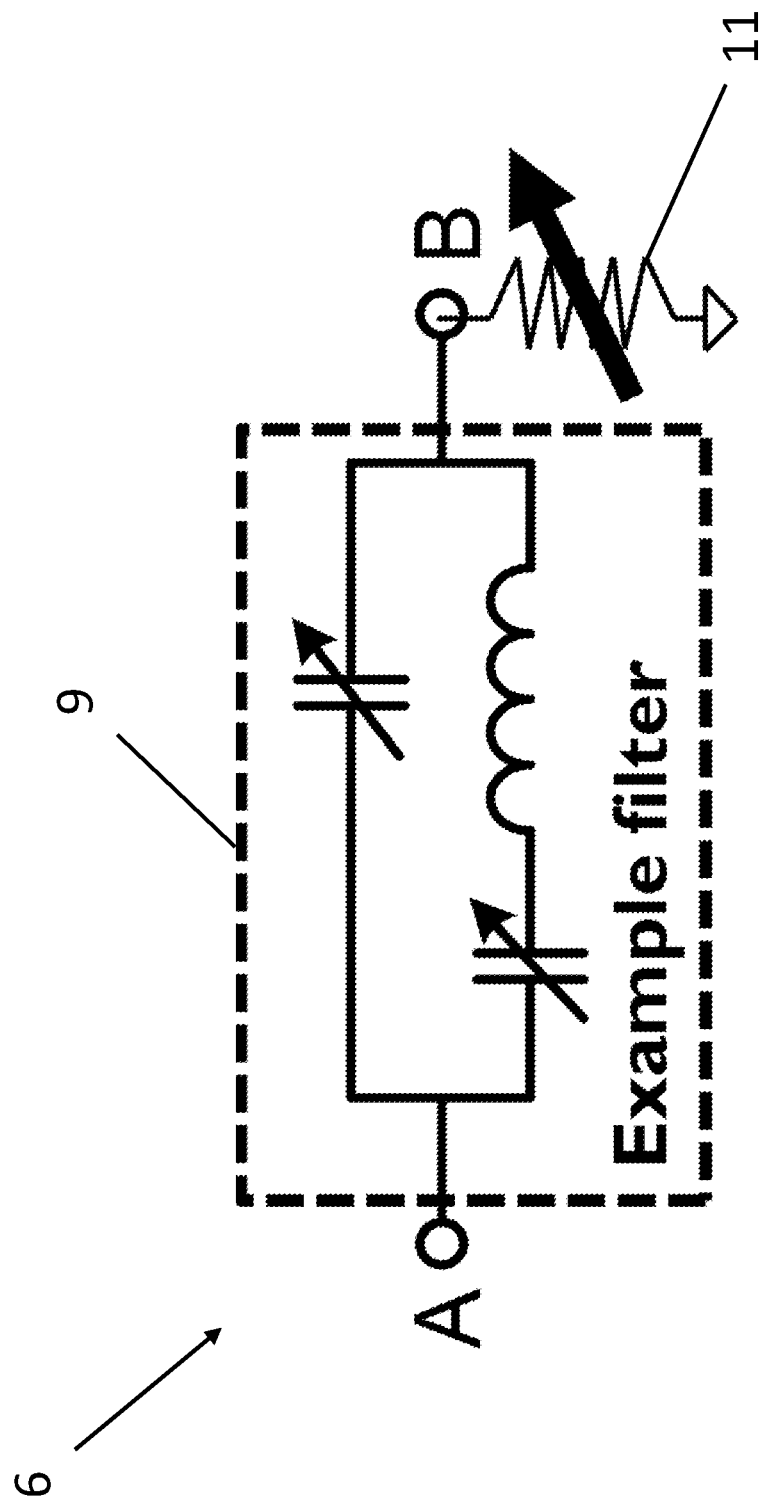
FIG. 10A shows an embodiment of a series connected third filter and a tunable impedance element for use in a tunable impedance circuit of an EBD circuit according to the second configuration, according to an example embodiment.
Figure 10C:
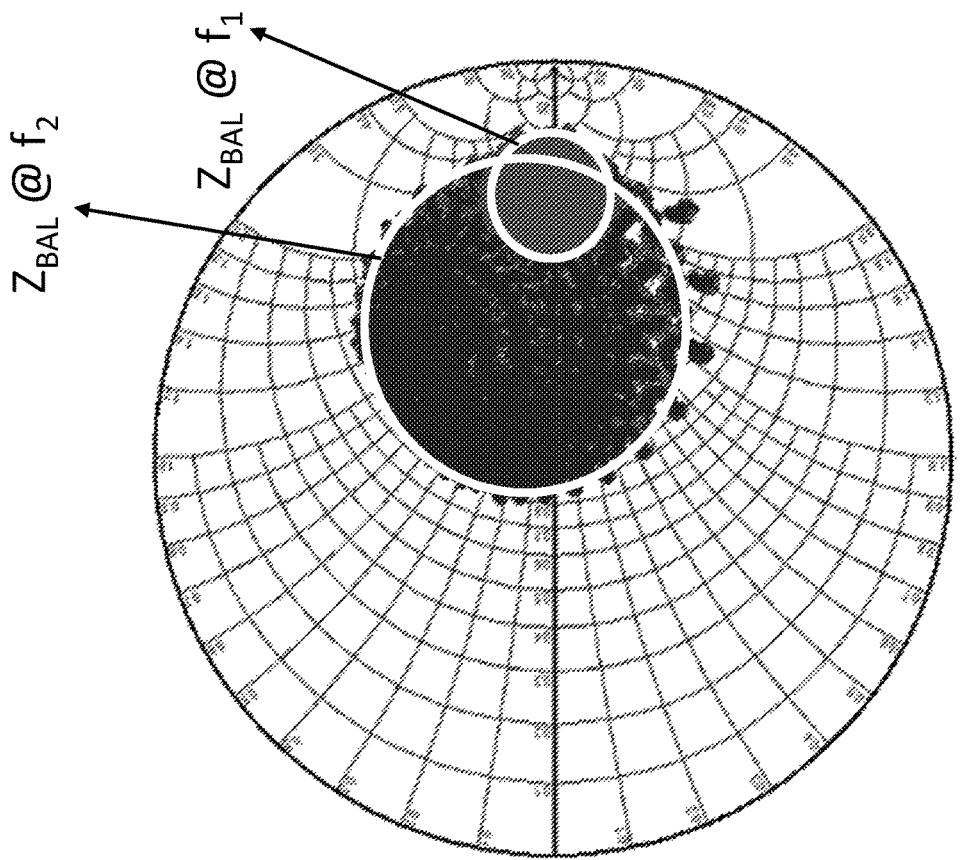
FIG. 10C shows a plot of the impedance seen looking into point A of the third filter of FIG. 10A when the tunable impedance element at point B is tuned at two different frequencies, $f_1$ and $f_2$, according to an example embodiment.
Figure 10B:
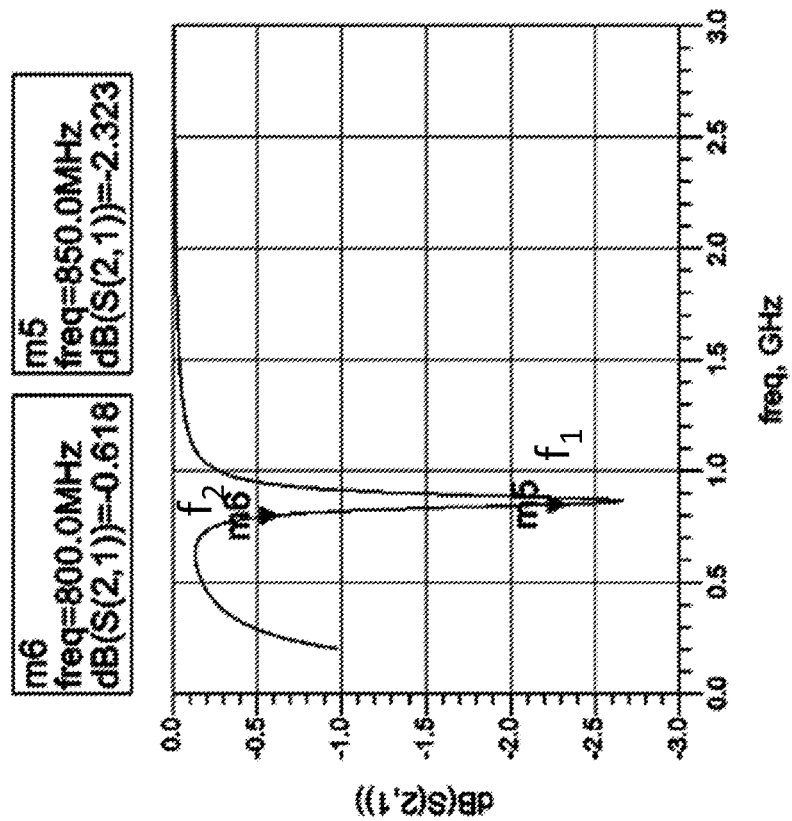
FIG. 10B shows the filtering response of the third filter of FIG. 10A, according to an example embodiment.

Consider FIG. 10A which shows an example implementation of filter 9, FIG. 10B which shows its filtering characteristic with a 50 Ω termination at point B and FIG. 10C which shows the impedance looking into node A when the impedance termination at point B is tuned across a certain VSWR.

At the higher frequency (in the 850 MHz stop-band) the variability of the impedance is now greatly reduced across codes, even when only 2 dB of filtering is achieved in the example topology. At the same time, the impedance at the pass-band frequency can still be tuned across a wide tuning range. This illustrates the concept of using filtering in in the balance network $Z_{BAL}$ 6 to guarantee a minimum isolation without tuning the electrical balance condition specifically at that frequency. Note that in this example, the RX frequency (pass) is lower than the TX frequency (stop), which in most typical bands is of course reversed. The concept still works for the reversed case, however.

Implementation Schematic

Figure 11:
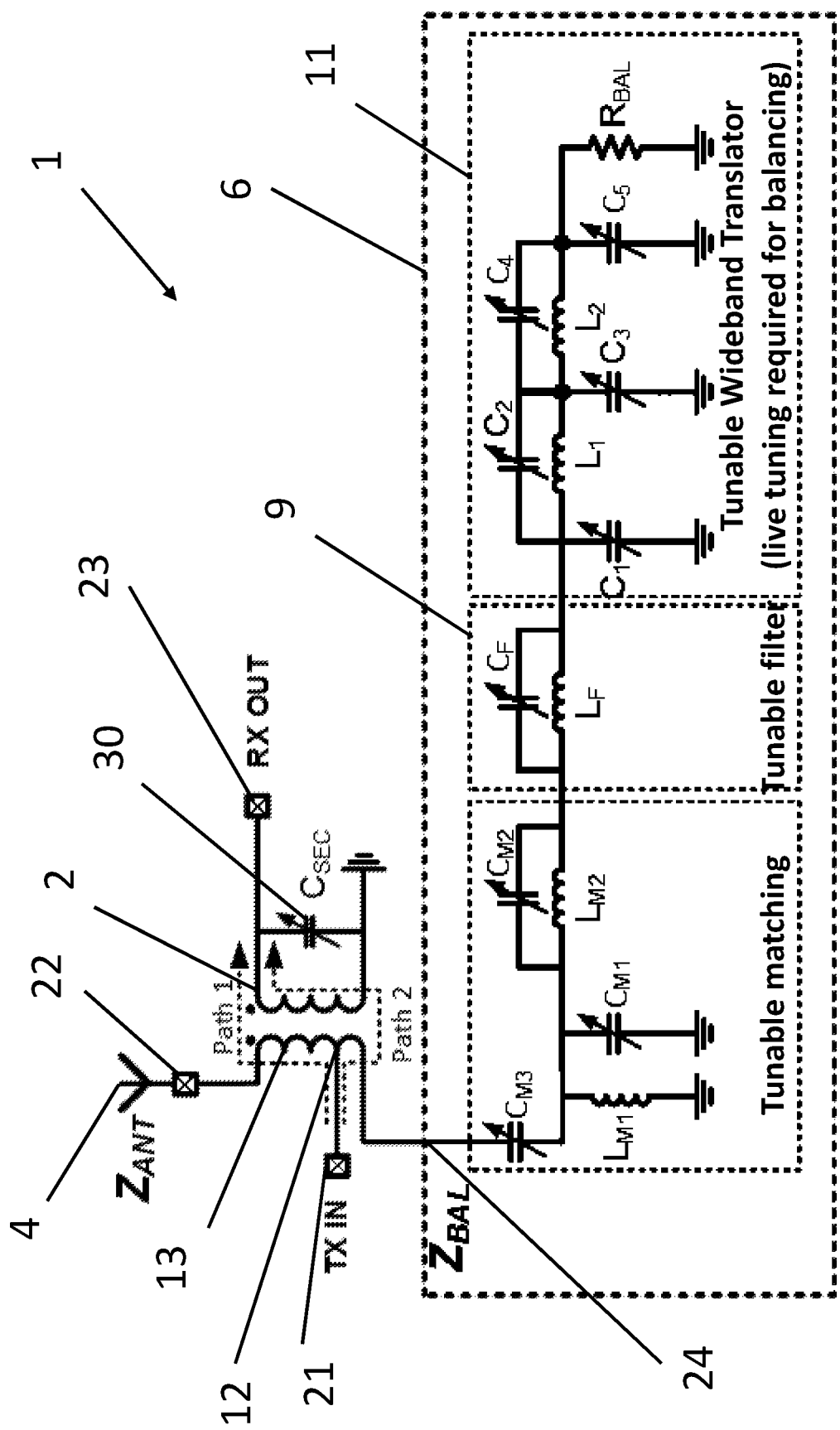
FIG. 11 shows an embodiment of the EBD circuit according to an example embodiment.

FIG. 11 shows the schematic of the EBD circuit 1 together with the topology of the balance network 6. It shows the hybrid transformer 2 skewed to favour RX loss. Furthermore, it shows the secondary side capacitor $C_{SEC}$ 30 for RX loss optimization. The capacitor $C_{SEC}$ 30 is used for impedance matching between the hybrid transformer 2 and the RX port 23, and may be a tunable capacitor, but may also be a non-tunable capacitor.

For all components in FIG. 11, Table 2 shows their values and Q estimated at 850 MHz across the tuning range, where applicable.

TABLE 2

Balance network component values, tuning ranges, and Q summary.

| Component name | Component value | Est. Q @ 850 MHz | #-of-bits |
| --- | --- | --- | --- |
| $L_{M1}$ | 5.9 nH | >26 | — |
| $L_{M2}$ | 7.2 nH | >27 | — |
| $L_F$, $L_{B1}$ | 4.2 nH | >23 | — |
| $L_{B2}$ | 5.0 nH | >24 | — |
| $C_{M1}$, $C_{M2}$ | 0.5-2.45 pF | >40 | 9 |
| $C_{M3}$, $C_F$ | 7.8-14.9 pF (6.9 pF offset) | >50 | 8 |
| $C_{B1,3,5}$, $C_{SEC}$ | 0.9-4.4 pF (300 fF offset) | >35 | 10 |
| $C_{B2}$ | 0.8-7.9 pF | >25 | 10 |
| $C_{B4}$ | 1.4-8 pF (830 fF offset) | >50 | 9 |
| $R_L$ | 150 Ohm | N/A | — |

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different

What is claimed is:

1. A front-end module (FEM) for a telecommunication device, the FEM comprising an electrical balance duplexer (EBD) circuit comprising a hybrid transformer configured for being coupled via:
   a transmit port to the telecommunication device to input a transmit signal comprising a signal to be transmitted at a first frequency from the telecommunication device;
   an antenna port to an antenna of the telecommunication device via a receive port to the telecommunication device to output a receive signal comprising a signal to be received at a second frequency to the telecommunication device; and
   a balance port to a tuneable impedance circuit which is part of the EBD circuit;
   wherein the EBD circuit is configured according to one of:
   a first configuration configured to isolate the transmit port from the receive port at the first frequency, wherein the FEM further comprises a first filter, at the transmit port, configured for attenuating the transmit signal with a predetermined amount at the second frequency, wherein, in the first configuration, the EBD circuit is configured for reducing signal transfer from the transmit port towards the antenna port at the second frequency up to a predetermined level at which the attenuation by the first filter is still able to compensate for a reduced isolation between the transmit port and the receive port at the second frequency; and
   a second configuration configured to isolate the transmit port from the receive port at the second frequency, wherein the FEM further comprises a second filter, at the receive port, configured for attenuating the receive signal with a predetermined amount at the first frequency.

2. The front-end module according to claim 1, wherein, in the first configuration of the EBD circuit, the tuneable impedance circuit is configured for being tuneable to balance its impedance with respect to an antenna impedance at the first frequency in order to isolate the transmit port from the receive port at the first frequency, and is configured for reducing signal transfer from the transmit port towards the antenna port at the second frequency up to a predetermined level at which the attenuation by the first filter is still able to compensate for a reduced isolation between the transmit port and the receive port at the second frequency.

3. The front-end module according to claim 2, wherein, in the first configuration of the EBD circuit, the tuneable impedance circuit comprises a series connected third filter and a tuneable impedance element, the third filter being configured for attenuating signals at the second frequency while allowing passage of signals at the first frequency.

4. The front-end module according to claim 1, wherein, in the second configuration, the EBD circuit is configured for reducing transmit signal losses from the transmit port towards the antenna port at the first frequency up to a predetermined level at which the attenuation by the second filter is still able to compensate for a reduced isolation between the transmit port and the receive port at the first frequency.

5. The front-end module according to claim 1, wherein, in the second configuration of the EBD circuit, the tuneable impedance circuit is configured for being tuneable to balance its impedance with respect to an antenna impedance at the second frequency in order to isolate the transmit port from the receive port at the second frequency, and is configured for reducing transmit signal losses from the transmit port towards the antenna port at the first frequency up to a predetermined level at which the attenuation by the second filter is still able to compensate for a reduced isolation between the transmit port and the receive port at the first frequency.

6. The front-end module according to claim 5, wherein, in the second configuration of the EBD circuit, the tuneable impedance circuit comprises a series connected third filter and a tuneable impedance element, the third filter being configured for attenuating signals at the first frequency while allowing passage of signals at the second frequency.

7. The front-end module according to claim 1, wherein the hybrid transformer is skewed towards the antenna port by an input tap which is positioned closer towards the antenna port in order to reduce transmit signal losses.

8. The front-end module according to claim 1, wherein the hybrid transformer is skewed towards the balance port by an input tap which is positioned closer towards the balance port in order to reduce receive signal losses.

9. The front-end module according to claim 1, wherein the tuneable impedance circuit is configured for reducing signal transfer from the transmit port towards the antenna port at least one further frequency.

10. The front-end module according to claim 9, wherein the tuneable impedance circuit comprises a series connected third filter and a tuneable impedance element, the third filter being configured for attenuating signals at the at least one further frequency.

11. A telecommunication device comprising the front-end module according to claim 1.

12. A method for operating a front-end module (FEM) for a telecommunication device including an electrical balance duplexer (EBD) circuit comprising a hybrid transformer configured for being coupled:
   via a transmit port to the telecommunication device to input a transmit signal comprising a signal to be transmitted at a first frequency from the telecommunication device;
   via an antenna port to an antenna of the telecommunication device;
   via a receive port to the telecommunication device to output a receive signal comprising a signal to be received at a second frequency to the telecommunication device; and
   via a balance port to a tuneable impedance circuit which is part of the EBD circuit, the method comprising one of:
   in a first configuration of the EBD circuit:
      inputting an input transmit signal in the EBD circuit from the telecommunication device via the transmit port;
      attenuating the input transmit signal with a predetermined amount at the second frequency by a first filter at the transmit port;
      inputting of a receive signal in the EBD circuit from the antenna via the antenna port;
      isolating the transmit port from the receive port at the first frequency by tuning the tuneable impedance circuit;
      outputting the attenuated input transmit signal to the antenna via the transmit port; and
      outputting the isolated input receive signal to the telecommunication device via the receive port, wherein, in the first configuration of the EBD circuit, the method further comprises the step of operating the EBD circuit for reducing signal transfer from the transmit port towards the antenna at the second frequency up to a predetermined level at which the attenuation by the first filter is still able to compensate for a reduced isolation between the transmit port and the receive port at the second frequency;

and in a second configuration of the EBD circuit:
inputting a transmit signal in the EBD circuit from the telecommunication device via the transmit port;
inputting a receive signal in the EBD circuit from the antenna via the antenna port;
isolating the transmit port from the receive port at the second frequency by tuning the tuneable impedance circuit;
attenuating the isolated input receive signal with a predetermined amount at the first frequency by a second filter at the receive port;
outputting the isolated input transmit signal to the antenna via the transmit port; and
outputting of the attenuated input receive signal to the telecommunication device via the receive port.

13. The method according to claim 12, wherein, in the first configuration of the EBD circuit, the method further comprises the steps of:
tuning an impedance of the tuneable impedance circuit to balance the impedance of the tuneable impedance circuit with respect to an antenna impedance at the first frequency, in order to isolate the transmit port from the receive port at the first frequency; and
tuning the impedance of the tuneable impedance circuit for reducing signal transfer from the transmit port towards the antenna port at the second frequency up to a predetermined level at which the attenuation by the first filter is still able to compensate for a reduced isolation between the transmit port and the receive port at the second frequency.

14. The method according to claim 13, wherein, in the first configuration of the EBD circuit, the step of tuning the impedance of the tuneable impedance circuit for reducing signal transfer from the transmit port towards the antenna port at the second frequency is performed by a third filter in the tuneable impedance circuit which is configured for attenuating signals at the second frequency while allowing passage of signals at the first frequency.

15. The method according to claim 12, wherein, in the second configuration of the EBD circuit, the method further comprises the step of operating the EBD circuit for reducing input transmit signal losses from the transmit port towards the antenna port at the first frequency up to a predetermined level at which the attenuation by the second filter is still able to compensate for a reduced isolation between the input transmit signal and the input receive signal at the first frequency.

16. The method according to claim 12, wherein, in the second configuration of the EBD circuit, the method further comprises the steps of:
tuning an impedance of the tuneable impedance circuit to balance the impedance of the tuneable impedance circuit with respect to an antenna impedance at the second frequency, in order to isolate the transmit port from the receive port at the second frequency; and
tuning the impedance of the tuneable impedance circuit for reducing input transmit signal losses from the transmit port towards the antenna port at the first frequency up to a predetermined level at which the attenuation by the second filter is still able to compensate for a reduced isolation between the transmit port and the receive port at the first frequency.

17. The method according to claim 16, wherein, in the second configuration of the EBD circuit, the step of tuning the impedance of the tuneable impedance circuit for reducing the input transmit signal losses from the transmit port towards the antenna port at the first frequency is performed by a third filter in the tuneable impedance circuit which is configured for attenuating signals at the first frequency while allowing passage of signals at the second frequency.

18. The method according to claim 12, wherein the method further comprises the step of tuning an impedance of the tuneable impedance circuit for reducing signal transfer from the transmit port towards the antenna port at least one further frequency.

19. The method according to claim 18, wherein the step of tuning the impedance of the tuneable impedance circuit for reducing signal transfer from the transmit port towards the antenna port at the at least one further frequency is performed by a third filter in the tuneable impedance circuit which is configured for attenuating signals at the at least one further frequency.

* * * * *